United States Patent
Dagher et al.

(10) Patent No.: US 9,733,329 B2
(45) Date of Patent: Aug. 15, 2017

(54) SYSTEM AND METHOD FOR FIELD MAP ESTIMATION

(71) Applicants: Joseph C. Dagher, Tucson, AZ (US); Ali Bilgin, Tucson, AZ (US)

(72) Inventors: Joseph C. Dagher, Tucson, AZ (US); Ali Bilgin, Tucson, AZ (US)

(73) Assignees: The General Hospital Corporation, Boston, MA (US); The Arizona Board of Regents on Behalf of The University of Arizona, Tucson, AZ (US)

( * ) Notice: Subject to any disclaimer, the term of this patent is extended or adjusted under 35 U.S.C. 154(b) by 593 days.

(21) Appl. No.: 14/373,532

(22) PCT Filed: Jan. 22, 2013

(86) PCT No.: PCT/US2013/022524
§ 371 (c)(1),
(2) Date: Jul. 21, 2014

(87) PCT Pub. No.: WO2013/110062
PCT Pub. Date: Jul. 25, 2013

(65) Prior Publication Data
US 2014/0375318 A1 Dec. 25, 2014

Related U.S. Application Data

(60) Provisional application No. 61/588,687, filed on Jan. 20, 2012, provisional application No. 61/735,278, filed on Dec. 10, 2012.

(51) Int. Cl.
*G01R 33/385* (2006.01)
*G01R 33/50* (2006.01)
(Continued)

(52) U.S. Cl.
CPC ....... *G01R 33/5615* (2013.01); *G01R 33/243* (2013.01); *G01R 33/385* (2013.01);
(Continued)

(58) Field of Classification Search
USPC .......................... 324/300–322; 600/407–435; 382/128–131
See application file for complete search history.

(56) References Cited

U.S. PATENT DOCUMENTS 3,530,373 A * 9/1970 Waugh ............... G01R 33/4641
324/311
7,952,353 B2 * 5/2011 Lu ........................ G01R 33/243
324/307
(Continued)

FOREIGN PATENT DOCUMENTS

RU 2216751 C2 11/2003

OTHER PUBLICATIONS

International Search Report and Written Opinion under date of mailing of Apr. 2, 2013 in connection with PCT/US2013/022524.

*Primary Examiner* — Melissa Koval
*Assistant Examiner* — Tiffany Fetzner
(74) *Attorney, Agent, or Firm* — Quarles & Brady LLP

(57) ABSTRACT

A system and method for determining a magnetic field map when using a magnetic resonance imaging (MRI) system to acquire images from a region of interest (ROI) of a subject. The method includes selecting a pulse sequence to elicit a plurality of echoes from the subject as medical imaging data from the subject. The method also includes optimizing an echo time for a dynamic range of interest during the pulse sequence ($SB_{max}$), a minimum signal-to-noise ratio ($SNR_0$) in the medical imaging data, and minimum T2* value in the ROI. The method further includes generating a magnetic field map estimation using the optimized echo times.

7 Claims, 8 Drawing Sheets

(51) Int. Cl.
*G01R 33/32* (2006.01)
*G01R 33/561* (2006.01)
*G01R 33/24* (2006.01)
*G01R 33/56* (2006.01)
*G01R 33/565* (2006.01)

(52) U.S. Cl.
CPC ......... *G01R 33/50* (2013.01); *G01R 33/5608* (2013.01); *G01R 33/32* (2013.01); *G01R 33/56563* (2013.01)

(56) References Cited

U.S. PATENT DOCUMENTS

| | | | |
|---|---|---|---|
| 8,326,010 B2 * | 12/2012 | Hofstetter | G01R 33/4804 382/128 |
| 2007/0219442 A1 | 9/2007 | Aletras et al. | |
| 2009/0227860 A1 * | 9/2009 | Dahnke | G01R 33/56563 600/420 |
| 2010/0283463 A1 * | 11/2010 | Lu | G01R 33/243 324/309 |
| 2011/0268332 A1 * | 11/2011 | Hofstetter | G01R 33/4828 382/131 |
| 2014/0375318 A1 * | 12/2014 | Dagher | G01R 33/243 324/309 |
| 2017/0059682 A1 * | 3/2017 | Dagher | G01R 33/243 |

* cited by examiner

SYSTEM AND METHOD FOR FIELD MAP ESTIMATION

CROSS-REFERENCE TO RELATED APPLICATIONS

This application represents the national stage entry of PCT International Application No. PCT/US2013/022524 filed Jan. 22, 2013, which claims the benefit of U.S. Provisional Patent Application Ser. No. 61/588,687 filed on Jan. 20, 2012, and U.S. Provisional Patent Application Ser. No. 61/735,278, filed on Dec. 10, 2012, the disclosures of which are hereby incorporated by reference in their entirety for all purposes.

STATEMENT REGARDING FEDERALLY SPONSORED RESEARCH

NA.

BACKGROUND OF THE INVENTION

The field of the invention is systems and methods for magnetic resonance imaging ("MRI"). More particularly, the invention relates to systems and methods for determining field maps for MRI.

When a substance such as human tissue is subjected to a uniform magnetic field (polarizing field B0), the individual magnetic moments of the excited nuclei in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, Mz, may be rotated, or "tipped", into the x-y plane to produce a net transverse magnetic moment Mt. A signal is emitted by the excited nuclei or "spins", after the excitation signal B1 is terminated, and this signal may be received and processed to form an image.

When utilizing these "MR" signals to produce images, magnetic field gradients (Gx, Gy, and Gz) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

Accurate information about the magnetic fields employed during a given MRI process is, often, very important to securing clinically-useful images. For example, "magnetic field maps" or "field maps" are often created to record information about any deviations from the desired or ideal magnetic field that is caused by B0-field inhomogeneities, chemical shift inhomogeneities or susceptibility-induced inhomogeneities. Accurate field maps are of critical importance in numerous MR applications, including functional MRI (fMRI), MR thermometry, MR spectroscopy, and many quantitative MR methods.

Common approaches to computing the field maps typically rely on acquiring multiple scans with different echo times to discern information about the inhomogeneities that are present. Unfortunately, a fundamental accuracy-dynamic range trade-off exists with multi-echo field mapping; namely, a large difference between the echo times (TE) reduces the maximum detectable field offset value and causes phase wrapping (or aliasing), while a shorter TE yields unreliable measurements with high variance. To overcome the resulting inaccuracies, a class of spatio-temporal post-processing algorithms, termed "phase unwrapping," has been proposed and developed. Specifically, the trade-off above could be summarized as follows: the actual phase signal could be any real number. However, the measured phase signal (or angle) can only be uniquely represented by values in a $2\pi$ range. A "wrapping" ambiguity occurs whenever the original phase signal exceeds $2\pi$ radians in any picture element (voxel). This happens in cases of (a) phase accumulation or (b) noise-induced phase accumulation. The unwrapping algorithms attempt to recover the original signal by determining the source of phase signal errors (wrapping, noise, or noise-induced phase wrapping). This ambiguity, however, can only be resolved under certain assumptions such as signal smoothness and no phase aliasing in regions known a priori.

Unfortunately, the imposition of a smoothness constraint on the measured data, reduces the spatial resolution of the measurements. Furthermore, the efficiency of these phase unwrapping algorithms often depends on the accuracy of the initial phase estimate, which requires expert user intervention. Further still, these phase unwrapping methods are computationally expensive, particularly in two-dimensions (2D) and higher, where the unwrapping problem becomes non-deterministic polynomial-time hard (NP-hard).

As such, other existing methods have been developed to overcome the inherent inaccuracies caused by the aforementioned tradeoffs in measuring inhomogeneities across multiple echoes. For example, some methods adopt a more statistical approach, but also rely on spatial regularization for robust mapping. Such smoothness assumptions may not be realistic as they do not account for small or abrupt variations common in MR images. Thus, such methods are particularly ill-suited for quantitative MR imaging, where physiological information is extracted from field maps. Ultimately, the performance of all these methods is subject to the trade-off inherent in the choice of the echo time spacing.

Therefore, it would be desirable to have a system and method for field map creation that is not subject to echo time spacing trade-offs and other inherent limitations of traditional methods, such as described above.

SUMMARY OF THE INVENTION

The present invention overcomes the aforementioned drawbacks by providing a system and method to determine high-resolution field maps over a large dynamic range and without falling prey to tradeoffs associated with echo time (TE) spacing.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
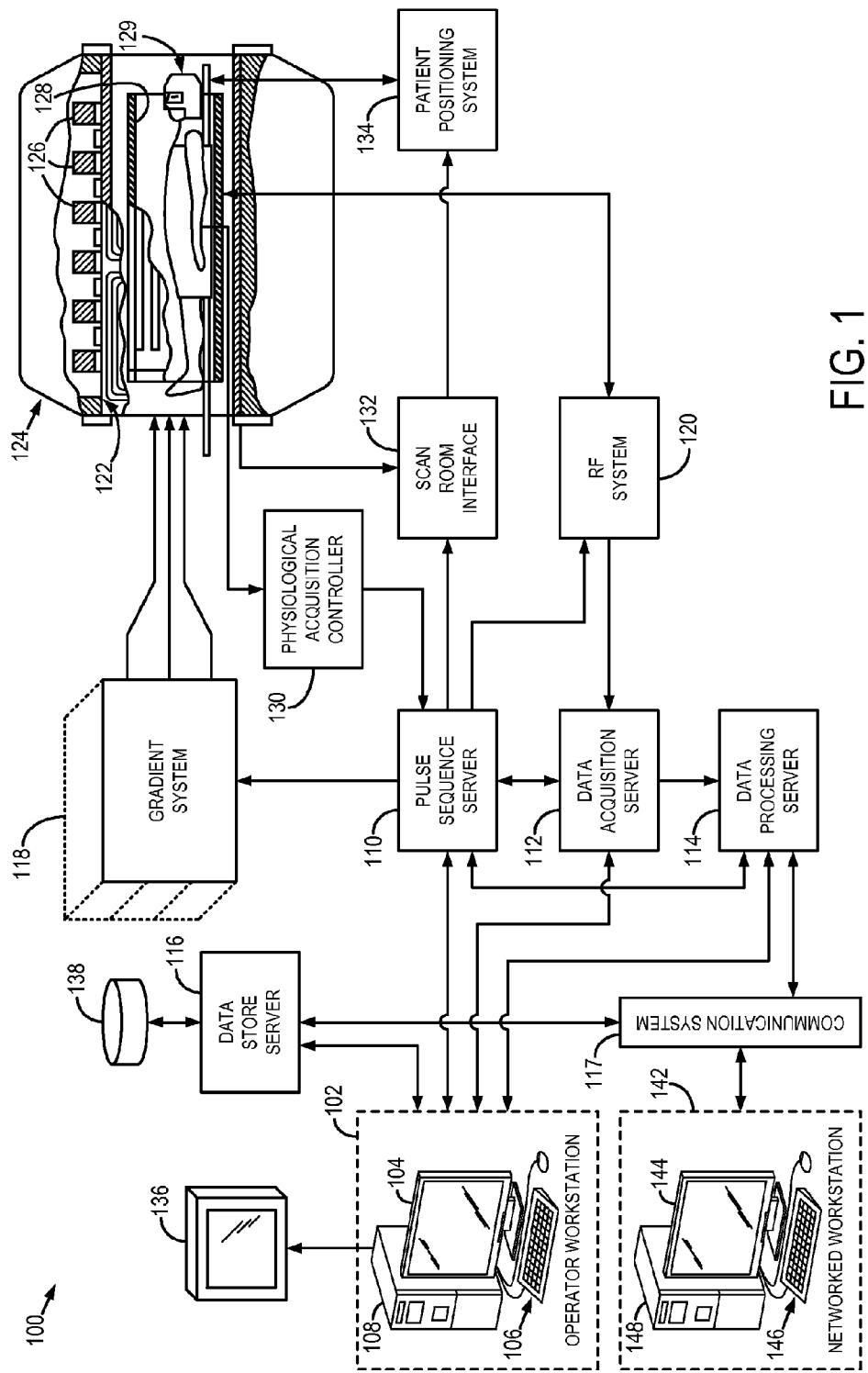
FIG. 1 is a block diagram of an example magnetic resonance imaging system configured for use with the present invention.

Referring particularly now to FIG. 1, an example of a magnetic resonance imaging (MRI) system 100 is illustrated. The MRI system 100 includes an operator workstation 102, which will typically include a display 104, one or more input devices 106, such as a keyboard and mouse, and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 117, which may include any suitable network connection, whether wired, wireless, or a combination of both. As an example, the communication system 117 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding magnetic resonance signals. The gradient coil assembly 122 forms part of a magnet assembly 124 that includes a polarizing magnet 126 and a whole-body RF coil 128 and/or local coil, such as a head coil 129.

RF waveforms are applied by the RF system 120 to the RF coil 128, or a separate local coil, such as the head coil 129, in order to perform the prescribed magnetic resonance pulse sequence. Responsive magnetic resonance signals detected by the RF coil 128, or a separate local coil, such as the head coil 129, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays, such as the head coil 129.

The RF system 120 also includes one or more RF receiver channels. Each RF receiver channel includes an RF preamplifier that amplifies the magnetic resonance signal received by the coil 128/129 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography (MRA) scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic.

The networked workstation 142, whether within the same facility or in a different facility as the operator workstation 102, may gain remote access to the data processing server 114 or data store server 116 via the communication system 117. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

The present invention provides systems and method for use with MRI systems, such as the above-described MRI system 100, to create field map estimations that are not subject to traditional limitations, such as echo time (TE) spacing trade-offs. Consider the measurement obtained using a spin-warp sequence at TE (3, 14, 15):

$$g(x,y;TE) = \rho(x,y;TE)\exp\{i2\pi\Delta B(x,y)TE\} + w(x,y) \quad (3).$$

In this equation, $\rho(x,y; TE)$ is the spin density at TE, $\Delta B(x,y)$ is the field value (in Hz) at location (x,y), and $w(x,y)$ is the additive complex-valued Gaussian noise, $w(x,y) = w_R(x,y) + iw_I(x,y)$, with $w_R, w_I \sim N(0,\sigma_w)$. Hereafter, the pixel subscripts (x, y) are dropped with the understanding that the remaining analysis applies separately to each voxel in the image. It is clear from equation (3) that $\Delta B$ can be computed from the slope of the phase of g as a function of TE. However, instead of the actual phase, we are restricted to work with the numerically computed angle, namely:

$$\psi_k = 2\pi\Delta B(TE_0 + k\Delta TE) + \Omega_k + 2\pi r_k \quad (4);$$

where $\Delta TE$ is the echo spacing, k is the echo index, $k = 0, \ldots, K-1$, $TE_0$ is the echo time at $k=0$, and $\Omega_k$ is the radian phase contribution of the additive noise term at time index k. Note that the phase noise Random Variable (RV) $\Omega_k$ is a function of the echo time. The integer $r_k$ in equation (4) is the phase wrapping term, which is non-zero when the sum of the first two terms on the right side of equation (4) falls outside $[-\pi,\pi)$. In that case, $r_k$ forces the total phase back into the observed range $[\pi,\pi)$.

It is clear from equation (2) that estimating the slope of $\psi_k$ is affected by two sources of error: noise and phase wrapping. The contribution of each source to the overall error is determined by the value of $\Delta B$ with respect to a cutoff given by:

$$\Delta B_{cutoff} = \frac{1}{2\Delta TE}. \quad (5)$$

The choice of $\Delta TE$ defines three regimes. In Regime I, $\Delta B$ in a given voxel is larger than $\Delta k_{cutoff}$ and phase aliasing (wrapping) dominates the error in that voxel. In Regime II, $\Delta B$ is much smaller than $\Delta B_{cutoff}$ and noise dominates in equation (4). Most field mapping methods choose moderate values for $\Delta TE$ in an attempt to trade-off Regimes I and II. Such a moderate value of $\Delta TE$ indicates Regime III. In addition to noise and phase-wrapping, Regime III is also amenable to noise-driven phase wrapping errors. Decoupling these errors can be achieved through the use of complex spatial regularization and phase unwrapping post-processing methods. This ultimately reduces the spatial precision of the resulting field maps. Furthermore, the robustness of these post-processing methods quickly decreases with the number of captured echoes K. There, the total scan time is the limiting factor.

Three-echo methods have recently been proposed in the literature. Windischberger et. al. (Windischberger, C., Robinson, S., Rauscher, A., Barth, M., and Moser, E., "Robust field map generation using a triple-echo acquisition.," Journal of Magnetic Resonance Imaging 20, 730-734 (October 2004).) used irregular echo spacing of 0.5 ms (Regime II) and 1.5 ms (Regime I) at 3T to demonstrate field maps over a limited dynamic range of 333 Hz. Assuming a maximum of a single phase wrap between echo pairs, Windischberger et. al. applied linear fitting to determine the best fit (in least squares sense) from seven possible phase wrap scenarios. Then, median and Gaussian filtering was applied to average errors inherent in the linear fitting process.

Aksit et. al. (Aksit, P., Derbyshire, J., and Prince, J., "Three-point method for fast and robust field mapping for EPI geometric distortion correction," 4th IEEE International Symposium on Biomedical Imaging, 141-144 (2007).) proposed another 3-echo method which computes an estimate of the phase twice, once using a very short $\Delta TE$ (Regime II) and another using a much longer $\Delta TE$ (Regime I). This method attempts to unwrap the long echo pair estimate using information from the short echo pair estimate.

Unlike these methods, as will be described, the present invention is able to quantify the ambiguity (error) space associated with a field estimate obtained with any given echo pair. Using an optimal choice of three echoes, the overall ambiguity space can be engineered to possess specific distinct features. A field map estimation routine is provided that takes advantage of such an engineered ambiguity space. As will be shown, this approach overcomes the trade-offs of Regimes I-III.

Phase Ambiguity Functions

A paradigm for quantifying the uncertainty in the field map estimate $\Delta \hat{B}_{0,1}$ when computed from two echoes, TE0 and TE1. Namely:

$$\Delta \hat{B}_{0,1} = \frac{\angle g(TE_1) - \angle g(TE_0)}{2\pi \Delta TE_{0,1}}; \quad (6)$$

where $\Delta TE_{0,1} = TE_1 - TE_0$ is the echo spacing. In the absence of phase wrapping, it has been shown that $\Delta \hat{B}_{0,1}$ is the Maximum Likelihood (ML) field map estimate for methods utilizing 2 echo acquisitions. The overall error in this estimate can be written as $$\varepsilon_{0,1} = \Delta \hat{B}_{0,1} - \Delta B = \frac{n_{0,1} + \frac{\Delta \Omega_{0,1}}{2\pi}}{\Delta TE_{0,1}}; \quad (7)$$

where $\Delta \Omega_{0,1} = \Omega_1 - \Omega_0$ is the difference between the phase noise random variables in equation (4), and $n_{0,1}$ denotes a phase wrapping integer which is non-zero whenever $2\pi \Delta B \Delta TE_{0,1} + \Delta \Omega_{0,1}$ falls outside $[-\pi,\pi)$. The probability density function (PDF) function of $\varepsilon_{0,1}$ describes the error in the estimate. This PDF gives rise to an uncertainty (ambiguity) about the original phase slope value, which is labeled as the Phase Ambiguity (PA) function.

Assuming that, over a range of field map values of interest, all possible values for $n_{0,1}$ are equally likely, we can show that the PA function of $\varepsilon_{0,1}$ can be written as:

$$x_1 = \alpha_1 f_{\Omega_1}(2\pi \Delta TE_{0,1}\varepsilon) * f_{\Omega_0}(2\pi \Delta TE_{0,1}\varepsilon) * \sum_p \delta\left(\varepsilon - \frac{p}{\Delta TE_{0,1}}\right); \quad (8)$$

where $\varepsilon$ is the observed error in Hz, $f_{\Omega_k}(w)$ is the PDF of $\Omega_k$ and * denotes the convolution operator. $\alpha_1$ is a PDF scaling parameter over the domain of $x_1$. Following derivations such as described in Hagmann, W. and Habermann, J., "On the phase error distribution of an open loop phase estimator," IEEE International Conference on Communications 2, 1031-1037 (1988), which is incorporated herein by reference in its entirety, $f_{\Omega_k}(w)$ can be written as:

$$f_{\Omega_k}(\omega) = \quad (9)$$
$$\frac{\exp\left(-\frac{\lambda_k^2}{2}\right)}{2\pi}\left\{1 + \lambda_k \sqrt{\frac{\pi}{2}} \cos\omega \exp\left(\lambda_k^2 \cos^2 \frac{\omega}{2}\right)\left[1 + \mathrm{erf}\left(\frac{\lambda_k \cos\omega}{\sqrt{2}}\right)\right]\right\};$$

where $$\lambda_k = 0.65 SNR_0 \exp\left(-\frac{TE_k - TE_0}{T2^*}\right); \quad (10)$$

and $SNR_0$ is the magnitude-domain SNR at $TE_0$, $SNR_0 = \rho(TE_0)/\sigma_{|\omega|}$. It is important to note that a limited sub-domain of the PA function are of interest that correspond to $[-2\delta B_{max}, 2\delta B_{max}]$ where $2\delta B_{max}$ is the maximum field value expected over a region of interest. Hereafter, the quantity $2\delta B_{max}$ is referred to as the dynamic range of the field map.

For example, FIGS. 2(a)-2(c) show example PA functions for acquisitions at an echo spacing $\Delta TE_{0,1}$ of 1.5 ms, 0.5 ms, and 1.0 ms, respectively. The PA functions are plotted on a log scale. The horizontal axis denotes the error in the field map estimate ($\varepsilon_{0,1}$ in Hz), while the vertical axis represents the likelihood of observing that error. The dynamic range of interest here is $2\delta B_{max} = 900$ Hz with a noise level corresponding to $SNR_0 = 10$. The minimum decay constant T2* is set to 12 ms. The PA function in FIG. 2(a) is dominated by wrapping errors, as can be seen from the multiple peaks. This is expected in Regime I, where field values are larger than the cutoff $\Delta B_{cutoff}$. On the other extreme, a very wide single lobe in FIG. 2(b) implies a noise-limited performance, characteristic of Regime II. Finally, a moderate choice of $\Delta TE_{0,1}$ in FIG. 2(c) displays a PA function with error contributions from both phase wrapping and noise, as well as noise-induced phase wrapping.

MAGPI

The trade-offs in field mapping Regimes I-III can be overcome using the Phase Ambiguity paradigm introduced above. Specifically, the underlying ambiguity can be resolved in accordance with the present invention by using a careful choice of, for example, three echoes.

Repeating the same analysis above using echo pairs 0 and 2, Phase Ambiguity $x_2$ is obtained where:

$$\varepsilon_{0,2} \square \Delta \hat{B}_{0,2} - \Delta B = \frac{n_{0,2} + \frac{\Delta\Omega_{0,2}}{2\pi}}{\Delta TE_{0,2}}; \quad (11)$$

and $$x_2 = \alpha_2 f_{\Omega_2}(2\pi \Delta TE_{0,2}\varepsilon) * f_{\Omega_0}(2\pi \Delta TE_{0,2}\varepsilon) * \sum_q \delta\left(\varepsilon - \frac{q}{\Delta TE_{0,2}}\right); \quad (12)$$

where $\varepsilon$ is the error variable in Hz, $f_{\Omega_k}(\omega)$ is as given in equation (9), $\Delta\Omega_{0,2} \square \Omega_2 - \Omega_0$, $= \Delta TE_{0,2} \square TE_2 - TE_0$, $n_{0,2} = 0, \pm 1, \pm 2, \ldots$, and $\alpha_2$ is a PDF scaling parameter over the range $[-2\delta B_{max}, 2\delta B_{max}]$.

At this point, it is prudent to identify two important properties from equations (8) and (12). Specifically, property PA-1 states that irrespective of the choice of echo times, the Phase Ambiguity functions will always have a non-zero peak at $\varepsilon_{0,1} = \varepsilon_{0,2} = 0$. That is, the original true solution is a common occurrence in both functions, irrespective of the value of the echoes and other parameters, such as SNR, T2*, and the like. The second property, property PA-2, states that, if both PA functions were identical, then this implies that knowledge of $\varepsilon_{0,2}$ does not reduce the ambiguity (or increase the information) about the true value of $\Delta B$, with respect to $\varepsilon_{0,1}$. And vice versa.

It is clear from these two properties that it is desirable for $x_1$ and $x_2$ to be maximally distinct. This ensures that the ambiguity remaining after measuring echoes $TE_0$, $TE_1$ and $TE_2$ is as close to the real value as possible. Therefore, it may be advantageous to choose echo times so that the resulting $x_1$ and $x_2$ are as distant as possible, over $[-2\delta B_{max}, 2\delta B_{max}]$. The distance between $x_1$ and $x_2$ can be denoted over this domain as $D(x_1, x_2)$.

The echo time optimization routine in accordance with the present invention then solves the following:

$$[TE_0^{opt}, TE_1^{opt}, TE_2^{opt}] = \qquad (13)$$

$$\underset{[TE_0, TE_1, TE_2]}{\operatorname{argmax}} D(x_1, x_2) \text{ such that, } [TE_0, TE_1, TE_2] \in C;$$

where C is the set of allowable echo times that could be utilized with the pulse sequence of choice. This formulation constitutes the basis of the joint acquisitionestimation method in accordance with the present invention, which we is referred to hereafter as, Maximum AmbiGuity distance for Phase Imaging (MAGPI).

Various distance measures D could be considered in order to maximize the distinction between $x_1$ and $x_2$. As an example, a geometric measure based on maximizing the minimum distance between respective peaks from $x_1$ and $x_2$ will be discussed. However, this measure alone would attempt to decrease the echo time spacings, which reduces the peaks' spacing but also broaden the peaks, as illustrated with respect to FIG. 2. The latter is undesirable since minimizing the overlap between the center peak of $x_1$ and that of $x_2$ is also desired, corresponding to the noisy wrap-free solution. The overall objective function D, thus, combines these two geometrical metrics, namely, D={minimum distance between ($x_1$, $x_2$) peaks}−{total width of central peaks}.

Figure 2:
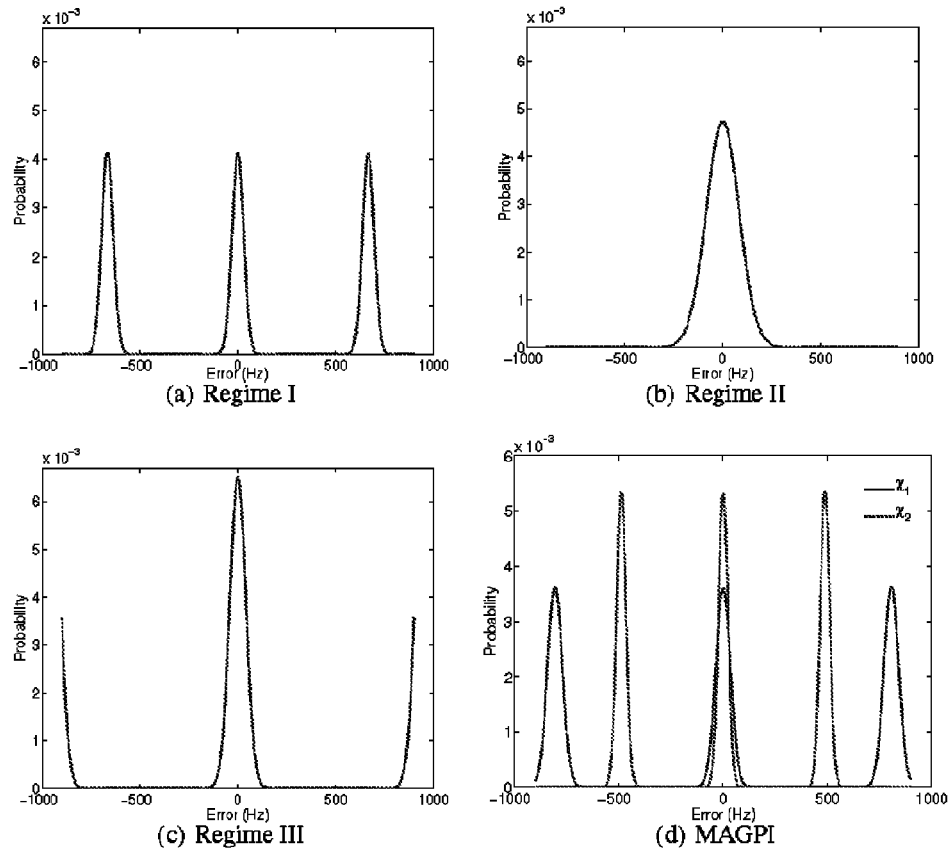
FIGS. 2(a)-2(d) are graphs of phase ambiguity functions at the echo times chosen using Regime I, Regime II, Regime III, and MAGPI techniques, respectively.

MAGPI can be applied, with a choice of D, to the acquisition scenario of FIG. 2. The echo times can be optimized to operate over a dynamic range of 900 Hz, a worst case $SNR_0$ of 10 and T2* values as low as 12 ms. In this example, the resulting optimal echo times were $TE_0$=2 ms, $TE_1$=3.24 ms, and $TE_2$=4.05 ms ($\Delta TE_{0,1}$=1.24 ms and $\Delta TE_{0,2}$=2.05 ms). The corresponding PA functions are shown in FIG. 2(d). Note that both echo pairs have a large spacing with respect to ½×900, thus operating in a wrap-dominated regime (Regime I). Nevertheless, the overlap pattern of the error distributions is engineered to disambiguate phase wrapping (due to minimal overlap of peaks) and reduce noise variance (due to large echo time spacings).

The optimization routine using equation (13) can be run offline, once. Equations (9), (10), and (13) establish that the only prior information needed to compute the optimal echo times with the above-described MAGPI technique are the maximum dynamic range of interest $2\delta B_{max}$, the minimum $SNR_0$, and the minimum expected T2* in the regions of interest (ROI or ROIs). The optimization problem can be solved, for example, using an adaptive simulated annealing (ASA) routine, for example, such as described in Ingber, A. L., "Adaptive simulated annealing (asa): Lessons learned," Control and Cybernetics 25(1), 33-54 (1996) or Oliveira, H. A., Ingber, L., Petraglia, A., Petraglia, M. R., and Machado, M. A. S., [Stochastic Global Optimization and Its Applications with Fuzzy Adaptive Simulated Annealing], ch. 4, Springer (2012), both of which are incorporated herein by reference in their entirety.

Corresponding Estimation Method: CL2D

The echoes optimized by equation (13) allow the resulting PA functions to be maximally distinct, in the sense defined by the metric D above. A corresponding estimation method can be provided that takes advantage of the designed ambiguity space in order to recover the original field map value. Similar to the distance metric D, this estimation algorithm is based on an intuitive geometrical approach.

Figure 3:
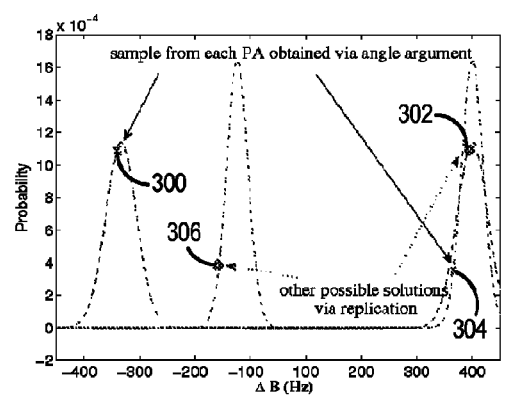
FIG. 3 is a graph demonstrating how techniques in accordance with the present invention can be used to select echoes optimized to allow the resulting phase ambiguity functions to be maximally distinct.

First, it is noted that the angle given by equation (6) corresponds simply to one sample realization from the PA function $x_1$. This is illustrated in FIG. 3 with the "x" marker 300 closest to the y-axis, where the horizontal axis denotes all possible field map values. This sample could have resulted from any one of the periodic peaks in $x_1$. Thus, replicating this sample by the inherent period of $1/\Delta TE_{0,1}$ results in the set of all possible solutions to equation (7) (such as illustrated by the "o" marker 302 furthest to the right), for this particular noise realization. Any one of these replicated values could in fact belong to the wrap-free peak of $x_1$. This ambiguity is readily resolved using the second echo pair ($TE_0$, $TE_2$): the same steps can be repeated for $\Delta B_{0,2}$ and its corresponding $x_2$ and obtain another set of values, as shown in FIG. 3 by the "x" and "o" indications at the interior of the graph. Given that the optimizer designed the two PA functions to be maximally distant, the two values from these sets that are closest to one another (in L2-distance sense) correspond to the two wrap-free peaks from $x_1$ and $x_2$. This is illustrated in FIG. 3. Finally, a field map estimate can be easily recovered by, for example, averaging these two closest values.

Figure 4:
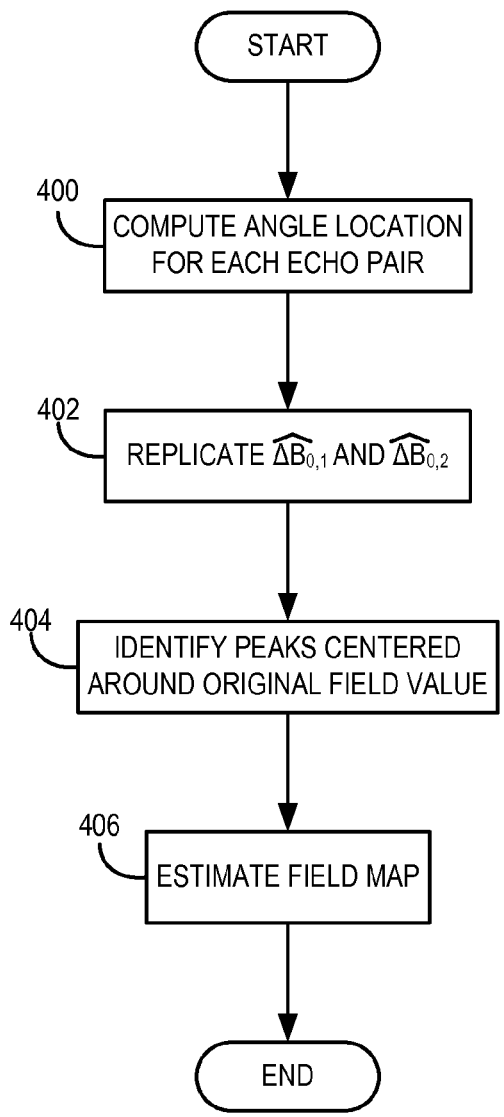
FIG. 4 is flow chart setting forth exemplary steps of a method for estimating a field map in accordance with the present invention.

This Closest-L2 Distance (CL2D) estimation method can be described with respect to FIG. 4. Specifically, the process starts at process block 400 by computing angle locations for each echo pair. That is, for each echo pair (0,1), the angle location (x,y) is computed. The result yields $\Delta \hat{B}_{0,1}(x,y)$ in equation (7). As illustrated in FIG. 3 by the "x" closest to the y-axis, the resulting value constitutes one realization from $x_1$. The procedure is repeated for the next echo pair (0,2), which results in the "x" marker 304 furthest to the right in FIG. 3.

At process block 402, $\Delta \hat{B}_{0,1}(x,y)$ and $\Delta \hat{B}_{0,2}(x,y)$ are replicated by $1/\Delta TE_{0,1}$ and $1/\Delta TE_{0,2}$, respectively, over the dynamic range of interest. Exemplary results are illustrated by the "o" markers 302, 306 in FIG. 3. The first marker set 300, 302 and the second marker set 304, 306 thus constitute a set of values from each PA function that would solve each of equations (7) and (11), respectively.

At process block 404, the solutions that produce peaks centered around the original field value are identified. As described above, the present invention recognizes that such solutions are closest, in the L2 sense, to one another. This recognition utilizes the prior information that all the peaks are designed by the optimizer to be maximally distant.

At process block 406, the field map is estimated as the weighted average of these closest two samples. The weighting can be designed to take into account the respective echo times. For example, later echoes may have a lower weighting to account for T2* effects. Note that, instead of the simple averaging at process block 406, other estimation methods can be used. It is also noted that the CL2D estimation method can be applied independently, one voxel at a time.

Figure 5:
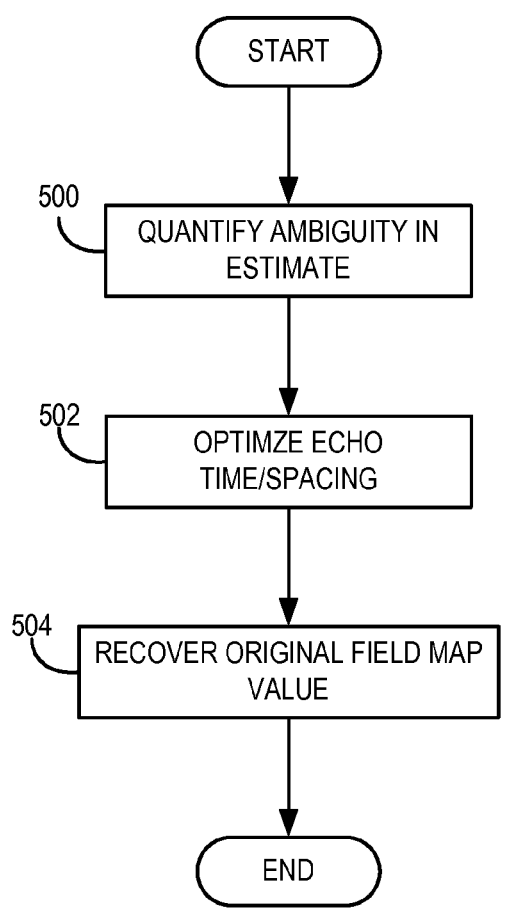
FIG. 5 is a flow chart setting forth a generalized set of steps of a method for estimating a field map in accordance with the present invention.

Referring to FIG. 5, the above-described techniques can be assembled into an overall process for determining robust high-resolution field maps obtained without the traditional trade-offs of Regimes I-III. Specifically, the process may include, at process block 500, quantifying the ambiguity in the field map estimate (PA function) for a given echo time spacing, for example, as described above, using equations (8), (9), and (12). At process block 502, three echo times (two echo spacings) can be optimized for a given $SNR_0$, T2*, and $\delta B_{max}$ of interest. As described above, the optimization can be determined such that the two resulting PA functions are maximally distinct using equation (13). At process block 504, the original field map value can be recovered using an estimation routine that takes advantage of the engineered ambiguity space described above.

EXAMPLE

Exemplary results were obtained at 7T with a cylindrical water phantom containing oil and air running in tubes along its long axis. The data was acquired on a 7T Siemens Trio scanner (Siemens Medical Solutions, Erlangen, Germany). The acquisition parameters were as follows: Field of View (FOV)=120×120 mm$^2$, slice thickness 1.5 mm, matrix size 256×256, flip angle 45 degrees, 8 slices, TR=185 ms, with fat saturation turned off, and automatic shimming turned on. The acquisition thus generates images with high spatial resolution, corresponding to 0.46×0.46×1.5 mm$^3$ voxels.

Further exemplary results were obtained in vivo. The ankle and brain of healthy volunteers were imaged after approval was obtained from our Institutional Review Board (IRB) and informed consent was given by the subjects. We acquired field offset maps in a subject's ankle using a Siemens 3T Trio. The offset map was obtained using GRE acquisitions at different echo times. All acquisitions employed the following parameters: FOV=300×300 mm$^2$, slice thickness 3 mm, matrix size 256×256, flip angle 55 degrees, 8 slices, TR=100 ms, with both fat saturation and automatic shimming turned off. The voxel size is thus 1.1×1.1×3 mm$^3$.

We also acquired field maps in a volunteer's brain using the 7T Siemens Trio. We used both, GRE acquisitions as well as Multi-Echo Gradient-Echo (MEGE) acquisitions. Both sequences acquire high resolution images, corresponding to approximately 0.33×0.33×1.5 mm$^3$ voxels. The parameters for the GRE acquisitions were: FOV=210×210 mm$^2$, slice thickness 1.5 mm, matrix size 640×640, flip angle 45 degrees, 8 slices, TR=180 ms, with both fat saturation and automatic shimming turned on. The parameters for the MEGE acquisitions were: FOV=146×210 mm$^2$, read out axis set along the shorter dimension, slice thickness 1:5 mm, matrix size 420×640, flip angle 55 degrees, 8 slices, TR=100 ms, with both fat saturation and automatic shimming turned on.

Figure 6:
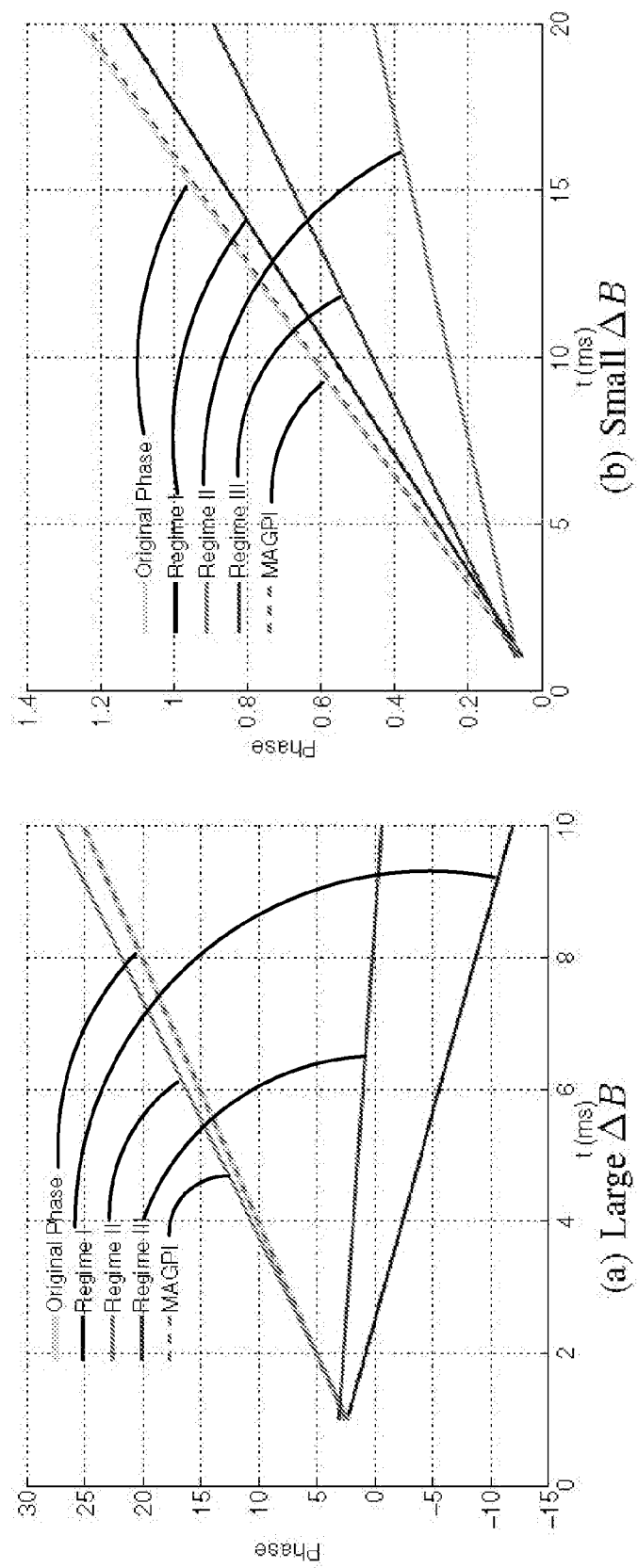
FIGS. 6(a) and 6(b) are graphs illustrating the trade-off in the choice of the echo time steps, as represented by Regime I, Regime II, and Regime III, and the present invention.

We illustrate in FIGS. 6(a) and 6(b) a basic numerical example highlighting the properties of each of the acquisitions discussed in FIG. 2. The example simulates GRE measurements taken at three echo times in two voxels with field offset values of 400 Hz (FIG. 6(a)) and 10 Hz (FIG. 6(b)). More particularly, the example illustrates the trade-off in the choice of the echo time steps, as represented by Regime I ($\Delta$TE=1.5 ms; $\Delta B_{cutoff}$=333 Hz), Regime II ($\Delta$TE=0.5 ms; $\Delta B_{cutoff}$=1 kHz), and Regime III ($\Delta$TE=1.0 ms; $\Delta B_{cutoff}$=500 Hz). The original linear phase) has a slope of (a) 400 Hz and (b) 10 Hz. In each of these traditional regimes, data is sampled regularly at 3 time intervals. The slope is estimated using a Least Squares fit. Regime I achieves the best results when the original slope is low, while Regime II produces a good estimate for large slope values. In Regime III, attempts to balance both regimes. The present invention's MAGPI technique samples the phase irregularly at 1.24 ms ($\Delta B_{cutoff}$≈403 Hz) and 2.05 ms ($\Delta B_{cutoff}$≈244 Hz), as optimized by MAGPI for 2$\delta B_{max}$=900 Hz, a worst case SNR$_0$ of 10 and minimum T2* of 12 ms (FIG. 2(d)). With a simple estimation procedure (CL2D), MAGPI achieves in this example the best performance for both the large and small slope values.

Figure 7:
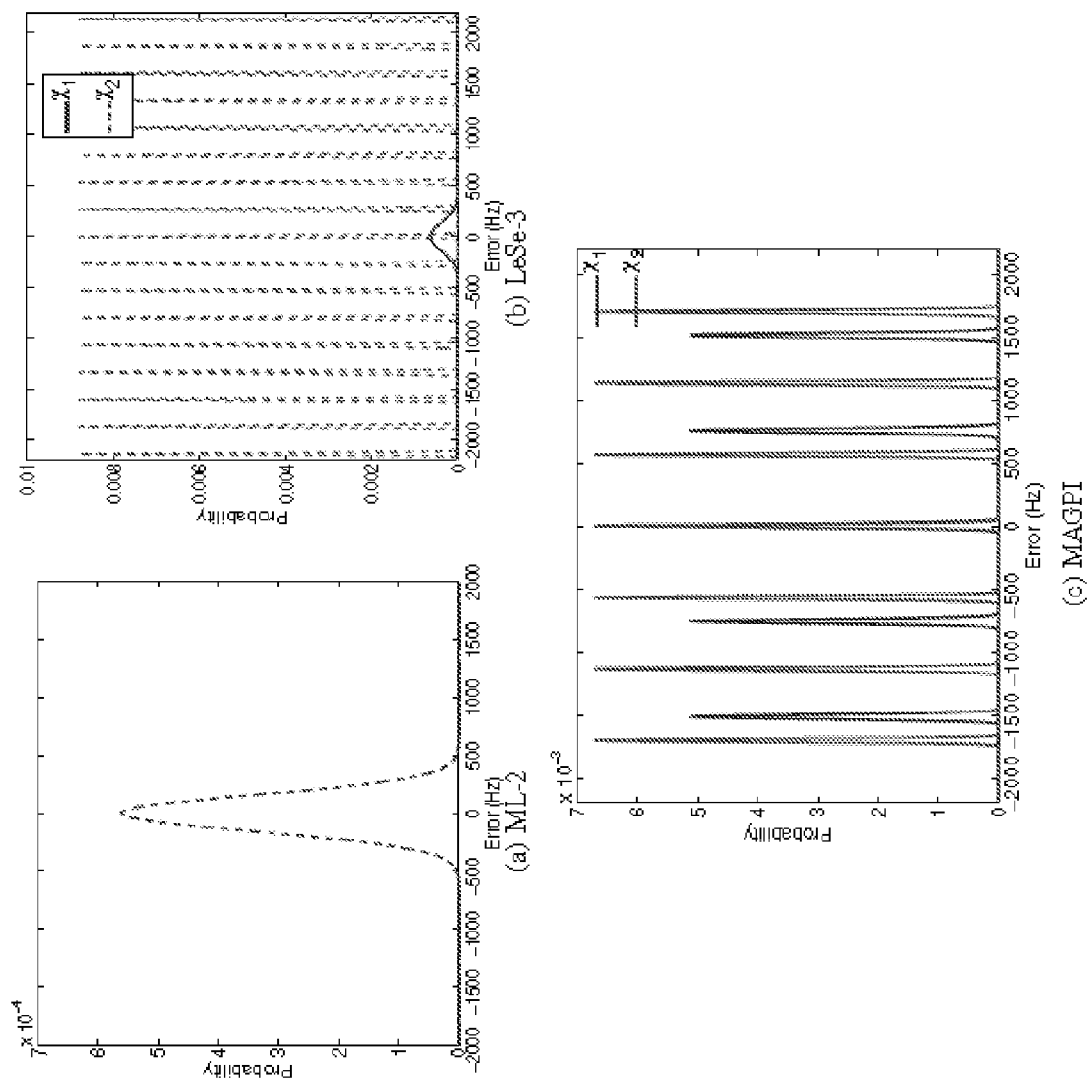
FIGS. 7(a)-7(c) are graphs illustrating phase ambiguity functions for phantom acquisitions corresponding to ML-2 echoes, LeSe echoes, and MAGPI echoes.

Validation of the performance of the field map estimation techniques of the present invention were favorable using both the phantom and in vivo imaging. With respect to phantom imaging, 16-point methods of DFT-16 and LS-16 were used as a "gold standard". Despite the fact that these field maps were obtained from the noise-limited Regime II, we expect improved robustness with 16 echoes in static phantoms with long T2* decay. Obviously, such long acquisitions are sub-optimal in practical applications, due to subject motion, T2* decay effects, and long acquisition times. In comparison, the commonly used two-point method, suffers from severe noise amplification. This behavior is justified by the acquisition's Phase Ambiguity function, as illustrated in FIG. 7(a). We immediately observed a single peak with a wide lobe extending over hundreds of Hertz, characteristic of a noise-limited regime.

The LeSe-3 method also exhibited large variations, despite using 3 echoes. To understand its performance, we also refer to the PA functions of LeSe-3, shown in FIG. 7(b). We note the significant overlap between the PA function of the short echo spacing pair $\Delta TE_{SE}$ and the PA function of the long echo spacing pair $\Delta TE_{le}$. As explained in Property PA-2 above, such an acquisition strategy leads to an inherent ambiguity about the true field value. Irrespective of the estimation algorithm used, such ambiguity could not be resolved without making additional assumptions about the spatial behavior of the field map (smoothing or regularization). The MAGPI technique in accordance with the present invention, on the other hand, uses echo times that result in maximally distant PA functions, as shown in FIG. 7(c). The resulting high-resolution field map looks visually very similar to those obtained with DFT-16 and LS-16, displaying robust and large dynamic range estimates, without the use of any spatial processing.

Figure 8:
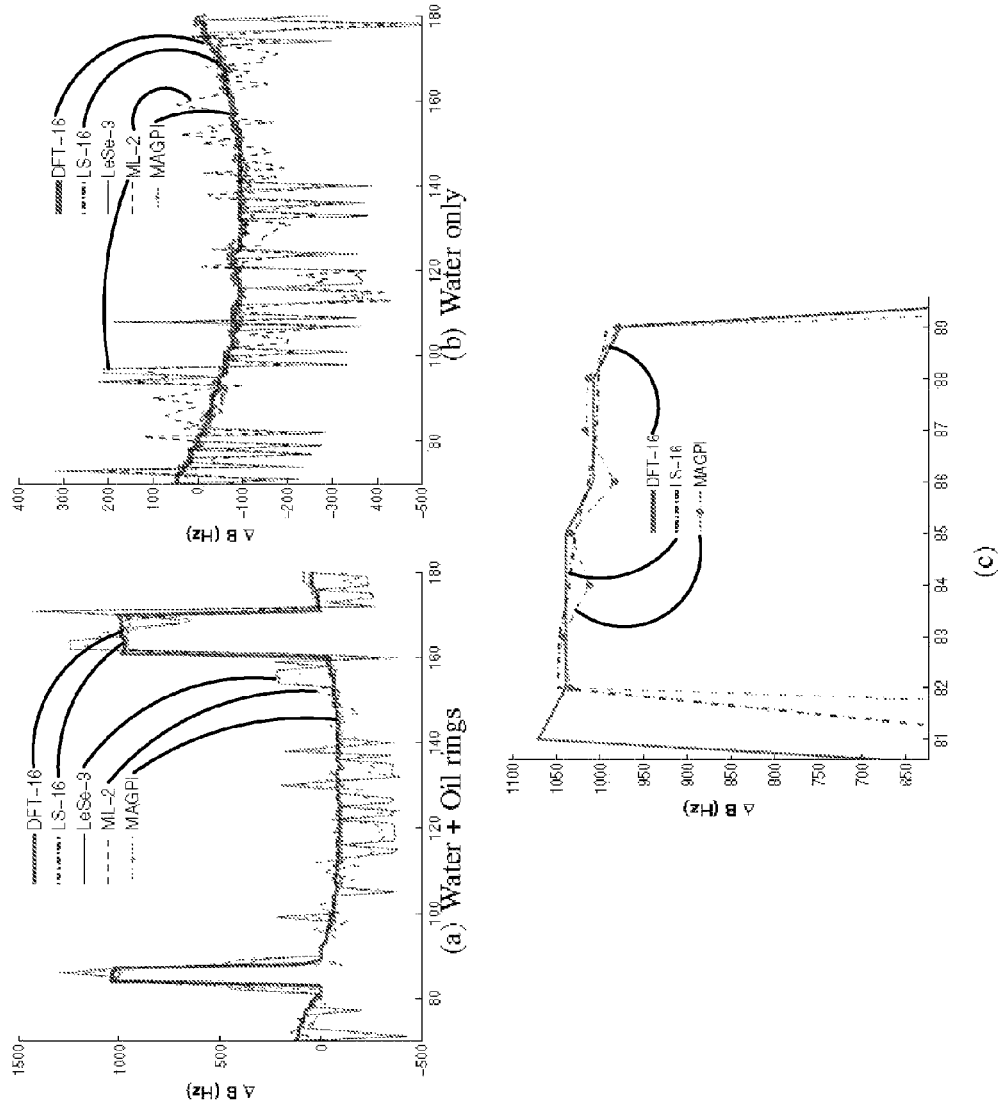
FIGS. 8(a) and 8(b) are graphs illustrating profiles through the water/oil phantom and FIG. 8(c) is a graph illustrating a magnified portion of FIG. 8(a).

We inspect these phantom results numerically in FIG. 8 by considering profiles along two different rows. The profile in FIG. 8(a) plots the field map through two oil rings and the water background, while the profile in FIG. 8(b) shows the field map in water only. FIG. 8(c) is a magnified profile through one oil ring. These plots demonstrate the efficiency and robustness of the MAGPI field estimates and their similarity to field maps obtained with 16 point methods. In comparison, LeSe-3 and ML-2 struggle to achieve the desired field map values, especially in water (FIG. 8(b)) where the performance of MAGPI is particularly impressive. The fact that MAGPI produces high resolution (0.46× 0.46×1.5 mm$^3$) field maps comparable to those obtained with 16-point methods, at 18 percent of the acquisition time, is noteworthy.

We also should emphasize that the smallest echo time spacing used with MAGPI in our phantom experiment would traditionally have caused aliasing for field values larger than $\Delta B_{cutoff}$≈379 Hz. The present invention was able to disambiguate field values up to a maximum value of 1100 Hz using the engineered structure of the PA functions. This implies an impressive gain in dynamic range of a factor of 2.9.

Regarding the efficacy of the methods of the present invention in vivo, the field map obtained in the ankle at 3T using DFT-16 was compared with that using MAGPI. The present invention was able to obtain a similar field offset map without noise or phase wrapping artifacts. It is important to point out here that MAGPI's field offset map appears to display finer structure than that obtained with DFT-16. That is attributed to slight subject motion, which we detected with the 16-echo scan. This highlights one important practical advantage of acquisitions with smaller number of echoes. In comparison, the LeSe-3 method was unable to attain the quality achieved with MAGPI nor DFT-16. Note that we chose a slightly larger $\Delta TE_{se}$ for the LeSe-3 method in order to increase its robustness (reduce the lobe width of its PA function). This reduces the noise-driven errors as compared to LeSe-3's performance in the phantom. However, this comes at the expense of increased wrapping artifacts, due to additional peaks in PA functions.

Recall that the field maps display the compounded effects of B0-field inhomogeneity and chemical shift. Any separation method which takes into account phase information will benefit from the joint acquisitionestimation strategy of the present invention, which removes inherent ambiguities in phase measurements.

We also generated field maps in the brain at 7T using GRE sequences. The present invention achieved more robust estimates as compared to methods with the same amount of acquisition time, such as LS-3. The field map obtained with MAGPI displayed high resolution features at a markedly reduced noise variance. The present invention also exhibited robust estimation for both large and low field map values across the brain, without spatial processing.

The second 7T experiment consisted of extracting field maps from a 3-echo MEGE sequence, often used for its faster acquisition time. The 1.2 ms minimum echo spacing constraint of this sequence imposes a maximum dynamic range of 417 Hz in field maps obtained with regularly spaced echoes. The LS-3 suffers from wrapping artifacts. Even though the long echo spacings reduced noise contributions as compared to the short echo spacings used with GRE and LS-3, they significantly increased wrapping errors. On the other hand, the present invention is readily suited for this additional echo time constraint, as incorporated in C. The optimal echo times, in this case TE1=4 ms, TE0=5.2 ms, and TE2=7 ms, were are designed to yield field maps over the dynamic range of 1600 Hz and a worst case SNR of 18. We note the location of the reference echo, TE0. Our optimizer in this case automatically determined that this arrangement is optimal as it reduces the value of the last echo time TE2, and in turn T2* decay effects. The resulting field map displayed properties similar to what we observed and validated in the phantom study: low variance in smooth regions and large dynamic range mapping up to 780 Hz. This is a significant 91% gain in dynamic range, as compared to sequences limited by the 1.2 ms minimum echo spacing constraint. In this example, hardware limitations constrain the dynamic range achievable even with 16-point methods. However, the MAGPI technique was immune to this constraint and becomes an important tool in such applications.

Therefore, the theoretical noise PDF with respect to equation (9), and PA functions with respect to equations (8) and (12) were validated using numerical simulations and phantom data. The histograms perfectly match theoretical predictions for various scenarios.

The optimizer of the present invention can choose the echo times based on worst case imaging scenarios, corresponding to a maximum dynamic range and minimum $SNR_0$ and T2* of interest. In validations, these values were picked based on prior knowledge of the magnetic field strength, the sequence parameters, and the material of interest.

The table below lists optimal echo time prescriptions for various imaging scenarios commonly encountered at 3T.

| | $SNR_0$ | | | | |
|---|---|---|---|---|---|
| T2* | 13 | 14 | 17 | 30 | 31 |
| 12 ms | (1.43, 2.57) | (1.6, 2.65) | (2.55, 3.83) | (3.74, 5) | (3.74, 5) |
| 15 ms | (1.43, 2.64) | (1.56, 2.67) | (2.55, 3.83) | (3.74, 5) | (3.74, 5) |

It is clear that, at high SNRs, the MAGPI echo time spacings do not drastically change with T2* or $SNR_0$. However, at low SNRs, the optimal echo spacings are more sensitive to the minimum expected T2* and $SNR_0$. Furthermore, note that the echo time spacings get smaller at low T T2* and $SNR_0$, in order to avoid noise-induced phase wrapping. The formulation of the present invention, thus, particularly important in the latter imaging scenarios, which are encountered in high resolution rapid field mapping.

It is contemplated that other search routines, other than the numerical optimization algorithm described above may be used. However, such search routines would depend on both the distance measures chosen and the proposed estimation algorithm. The above-described invention focuses on the overall framework and a general numerical method that can be used to generate echo times suitable for arbitrary scenarios of interest, but is not limited to a specific subroutine or algorithm.

Figure 9:
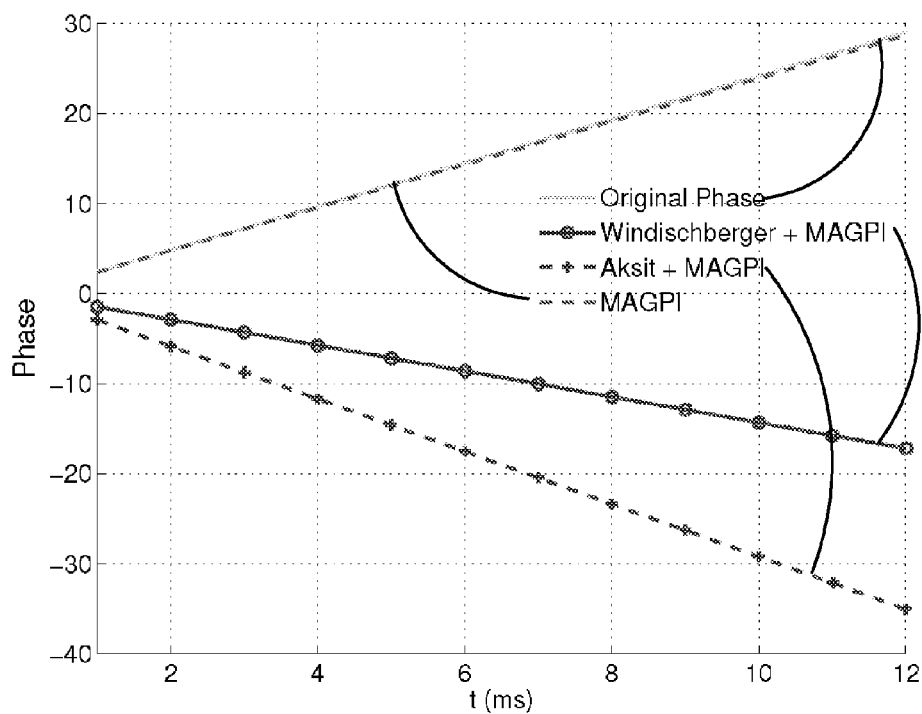
FIG. 9 is a graph illustrating estimated performance of prior-art methods compared with method in accordance with the present invention.

In addition to the CL2D method in accordance with the present invention, there exist multiple estimation algorithms that could be used to recover the original field map value from the optimized MAGPI acquisitions. However, such methods should take into account the unique pattern of the designed PA function in order to disambiguate the errors. This point is illustrated with respect to in FIG. 9, where estimation methods from the literature are used in conjunction with echoes optimized for the scenario of FIG. 2(d). The original phase has a slope of 380 Hz, in a voxel with $SNR_0$ of 10 and T2* of 12 ms. Methods "Windischberger+MAGPI" and "Aksit+MAGPI" use the 3 echoes described with respect to FIG. 1(d), along with the estimation algorithm presented in Windischberger, C., Robinson, S., Rauscher, A., Barth, M., and Moser, E., "Robust field map generation using a triple-echo acquisition.," Journal of Magnetic Resonance Imaging 20, 730-734 (October 2004) and Aksit, P., Derbyshire, J., and Prince, J., "Three-point method for fast and robust field mapping for EPI geometric distortion correction," 4th IEEE International Symposium on Biomedical Imaging, 141-144 (2007), respectively. Clearly, in this case, estimation routine (CL2D) of the present invention is the only method that takes into account the ambiguity space designed by MAGPI in order to resolve the correct phase. That is, only CL2D utilized the feature of the designed ambiguity space while the remaining methods still suffered from the noise-phase wrapping ambiguities.

The estimation methods of the present invention have not used any form of spatial regularization/processing. This makes CL2D and MAGPI highly suitable for high resolution field mapping. By way of example, the above discussion was generally restricted to voxel-per-voxel estimation methods that constitute the bases of commonly used techniques. However, one of ordinary skill in the art will recognize that any additional spatial regularization could be applied to all methods presented here.

Thus, the present invention has been demonstrated to provide a new paradigm for estimating off-resonance maps using 3 echoes only. The echo time optimizer of the present invention is able to explore search spaces corresponding to large echo time spacing, which is not considered by traditional methods. The present invention is able to simultaneously combine in 3 echoes all the advantages of large echo spacings without their inhibiting wrapping constraints. The MAGPI scheme selects the echo times and characterizes the resulting phase errors so as to be maximally disambiguated in estimation.

The MAGPI technique overcomes many of the traditional constraints on field maps, as demonstrated above. For example, in methods in accordance with the present invention, (i) reducing ΔTE is not generally required to increase the dynamic range, (ii) using large ΔTE is generally no longer limited by wrapping artifacts and, (iii), generally, no spatial regularization or phase unwrapping are needed. The first two properties (i) and (ii) result in reduced phase uncertainty and increased robustness, while property (iii) demonstrates an increase in the resulting spatial resolution at a drastically reduced computation time. Three echo times can be optimized to yield low noise, high dynamic range field maps, over a spectral dynamic range of interest. The echo times can be designed before image acquisition so as to maximally disambiguate the phase in estimation. The echo time optimization can uses knowledge of the worst case signal-to-noise Ratio (SNR) and largest field offset value in the region of interest to further improve results.

Thus, a joint acquisition-processing solution to the problem of field map estimation is provided. Data at three echo times can be carefully chosen to yield field map estimations using the corresponding algorithm. Over an arbitrary spectral range of inhomogeneity values, the method is not subject to the traditional noise-bandwidth tradeoff. The resulting implications include improved robustness, enhanced spectral estimation and eliminating the need for spatial phase unwrapping.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
a magnet system configured to generate a polarizing magnetic field about at least a region of interest (ROI) in a subject arranged in the MRI system;
a plurality of gradient coils configured to apply a gradient field to the polarizing magnetic field;
a radio frequency (RF) system configured to apply an excitation field to the subject and acquire MR image data from a ROI;
a computer system programmed to:
select a pulse sequence to be performed by the plurality of gradient coils and RF system to elicit at least three echoes from the subject as medical imaging data;
compute angle locations for different pairs of the at least three echoes and magnetic field map estimates;
replicate the magnetic field map estimates over a dynamic range of interest associated with the pulse sequence;
identify magnetic field map estimates that provide a desired solution to a phase ambiguity function; and
using the magnetic field map estimates that provide the desired solution in order to indicate a magnetic field map solution based on one of the pair of echoes selected from the at least three echoes; and store the indicated magnetic field map solution in a memory for later use.

2. The MRI system of claim 1 wherein the computer system is further programmed to create a weighted combination of the magnetic field map estimates that provide the desired solution in order to generate the magnetic field map solution.

3. The MRI system of claim 1 wherein the computer system is configured to compute the angle locations for each of the different pairs of the at least three echoes (0, 1) as an angle location (x, y) that yields magnetic field map estimates, $\Delta\hat{B}_{0,1}(x, y)$ in the following:

$$\varepsilon_{0,1} = \Delta\hat{B}_{0,1} - \Delta B = \frac{n_{0,1} + \frac{\Delta\Omega_{0,1}}{2\pi}}{\Delta TE_{0,1}}$$

where $\varepsilon_{0,1}$ is an estimate error, $n_{0,1}$ denotes a phase wrapping integer which is non-zero whenever $2\pi\Delta B\Delta TE_{0,1} + \Delta\Omega_{0,1}$ falls outside $[-\pi,\pi)$ $\Delta\Omega_{0,1} = \Omega_1 - \Omega_0$ is a difference between phase noise random variables in $\psi_k = 2\pi\Delta AB(TE_0 + k\Delta TE) + \Omega_k + 2\pi r_k$, where $\Delta TE$ is an echo spacing between each of the different pairs of the at least three echoes, k is an echo index, $k=0, \ldots, K-1$, $TE_0$ is an echo time at $k=0$, and $\Omega_k$ is a radian phase contribution of an additive noise term at time index k.

4. The MRI system of claim 1 wherein the at least three echoes is three echoes.

5. A magnetic resonance imaging (MRI) system comprising:
a magnet system configured to generate a polarizing magnetic field about at least a region of interest (ROI) in a subject arranged in the MRI system;
a plurality of gradient coils configured to apply a gradient field to the polarizing magnetic field;
a radio frequency (RF) system configured to apply an excitation field to the subject and acquire MR image data from a ROI;
a computer system programmed to:
select a pulse sequence to be performed by the plurality of gradient coils and RF system in order to elicit at least three echoes from the subject as medical imaging data;
select echoes from the at least three echoes to derive phase ambiguity functions that control an ambiguity of magnetic field values in the ROI;
using the selected echoes and the derived phase ambiguity functions in order to select phase-wrap free values associated with the magnetic field created by the magnet system, the plurality of gradient coils, and RF system;
using the phase-wrap free values in order to derive a magnetic field map; and
storing the derived magnetic field map for later use.

6. The MRI system of claim 5 wherein the computer system is further programmed to derive phase ambiguity functions that are designed to be maximally distant with respect to a defined metric, D, in order to maximize a distinctiveness of $x_1$ and $x_2$, where:

$$x_1 = \alpha_1 f_{\Omega_1}(2\pi\Delta TE_{0,1}\varepsilon) * f_{\Omega_0}(2\pi\Delta TE_{0,1}\varepsilon) * \sum_p \delta\left(\varepsilon - \frac{p}{\Delta TE_{0,1}}\right)$$

and $$x_2 = \alpha_2 f_{\Omega_2}(2\pi\Delta TE_{0,2}\varepsilon) * f_{\Omega_0}(2\pi\Delta TE_{0,2}\varepsilon) * \sum_q \delta\left(\varepsilon - \frac{q}{\Delta TE_{0,2}}\right)$$

where $TE_0$ and $TE_1$ represent at least two of the selected echoes, such that $\Delta TE_{0,k} = TE_k - TE_0$ is an echo spacing, s is an observed error in Hz, $f_{\Omega_k}()$ is a probability density function of a radian phase contribution of noise, $\Omega_k$, * denotes a convolution operator, and $\alpha_k$ is a probability density function scaling parameter over a domain of $x_k$.

7. A method for determining a magnetic field map when using a magnetic resonance imaging (MRI) system to acquire images from a region of interest (ROI) of a subject, the steps of the method comprising:
a) selecting with a computer system, an MRI pulse sequence in order to elicit at least three echoes from the subject as medical imaging data that is obtained from the subject;
b) optimizing with the computer system, an echo time for a dynamic range of interest during the MRI pulse sequence ($\delta B_{max}$), a minimum signal-to-noise ratio ($SNR_0$) in the medical imaging data, and a minimum $T2^*$ value in the ROI;

c) generating with the computer system, a magnetic field map estimation for the selected MRI pulse sequence using the optimized echo times, and
d) storing the generated magnetic field map estimation in a memory of the computer system for later use.

\* \* \* \* \*